(12) United States Patent
Hayashi

(10) Patent No.: US 7,291,976 B2
(45) Date of Patent: *Nov. 6, 2007

(54) LIGHT EMITTING DEVICE HAVING A PARTICULAR SEALING STRUCTURE

(75) Inventor: Kenji Hayashi, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/365,877

(22) Filed: Mar. 2, 2006

(65) Prior Publication Data

US 2006/0152153 A1 Jul. 13, 2006

Related U.S. Application Data

(63) Continuation of application No. 10/347,262, filed on Jan. 21, 2003, now Pat. No. 7,038,378.

(30) Foreign Application Priority Data

Jan. 22, 2002 (JP) ............................... 2002-12884

(51) Int. Cl.
*H01J 33/04* (2006.01)
(52) U.S. Cl. ...................... 313/512; 313/506
(58) Field of Classification Search ................ 313/512, 313/506, 504
See application file for complete search history.

(56) References Cited

U.S. PATENT DOCUMENTS

| 5,757,126 A | 5/1998 | Harvey et al. |
| 5,811,177 A | 9/1998 | Shi et al. |
| 6,050,494 A | 4/2000 | Song et al. |
| 6,198,217 B1 | 3/2001 | Suzuki et al. |
| 7,038,378 B2 * | 5/2006 | Hayashi ...................... 313/512 |
| 2002/0101156 A1 * | 8/2002 | Park et al. .................. 313/512 |
| 2003/0085654 A1 | 5/2003 | Hayashi |

FOREIGN PATENT DOCUMENTS

| JP | 2000-040586 | 2/2000 |
| JP | 2000-195662 | 7/2000 |
| JP | 2001-185349 | 7/2001 |
| JP | 2001-297878 | 10/2001 |
| JP | 2001-338754 | 12/2001 |
| JP | 2002-216948 | 8/2002 |
| WO | WO 00/65670 | * 11/2000 |

* cited by examiner

*Primary Examiner*—Karabi Guharay
(74) *Attorney, Agent, or Firm*—Oliff & Berridge, PLC

(57) ABSTRACT

A sealing substrate has first and second substrates. A hollow portion is formed in a first surface of the first substrate. The first substrate has a plate portion that forms a bottom surface of a hollow portion and a frame portion that forms an inner wall surface of the hollow portion. The second substrate is affixed to a second surface of the first substrate. The second substrate is formed of a material having a lower specific gravity than that of the first substrate.

14 Claims, 7 Drawing Sheets

US 7,291,976 B2

LIGHT EMITTING DEVICE HAVING A PARTICULAR SEALING STRUCTURE

This is a continuation of application Ser. No. 10/347,262 filed Jan. 21, 2003, now U.S. Pat No. 7,038,378 which is hereby incorporated by reference in its entirety. Japanese Patent Application No. 2002-12884, filed on Jan. 22, 2002, is hereby incorporated by reference in its entirety.

BACKGROUND OF THE INVENTION

The present invention relates to a sealing substrate, a method of fabricating the sealing substrate, a display device, and an electronic instrument.

A sealed structure is used for elements that use light-emitting materials and electrodes that are susceptible to the effects of moisture or oxygen, such as organic electroluminescent (EL) elements. A sealing substrate that is used in the art for sealing in an organic EL element is formed by carving out a glass substrate. The thickness of the glass substrate is determined in accordance with the depth of the carving. If a deep carving is formed in a thin glass substrate, the strength of the sealing substrate will be insufficient. To ensure strength, the sealing substrate is made thicker and heavier. It is possible to form a structure that has both a thick bonding layer with the organic EL panel and also a deep carving, but in such a case large amounts of moisture and oxygen permeate through the bonding layer.

BRIEF SUMMARY OF THE INVENTION

A sealing member in accordance with one aspect of the present invention comprises:

a first substrate which has a hollow portion formed in a first surface thereof, a plate portion forming a bottom surface of the hollow portion and a frame portion forming an inner wall surface of the hollow portion; and a second substrate attached to a second surface of the first substrate, wherein the second substrate is formed of a material of a specific gravity lower than a specific gravity of the first substrate.

A display device in accordance with one aspect of the present invention comprises:

the above-described sealing substrate; and a display section that has been sealed in by the sealing substrate.

An electronic instrument in accordance with one aspect of the present invention comprises the above-described display device.

A method of fabricating a sealing substrate in accordance with one aspect of the present invention comprises:

attaching a second plate-shaped member to a first plate-shaped member, then forming a hollow portion that is dug out of a surface of the first plate-shaped member on the opposite side to the surface on which the second plate-shaped member is attached, wherein the second plate-shaped member is formed of a material having a specific gravity that is less than a specific gravity of the first plate-shaped member.

DETAILED DESCRIPTION OF THE EMBODIMENTS

Figure 1:
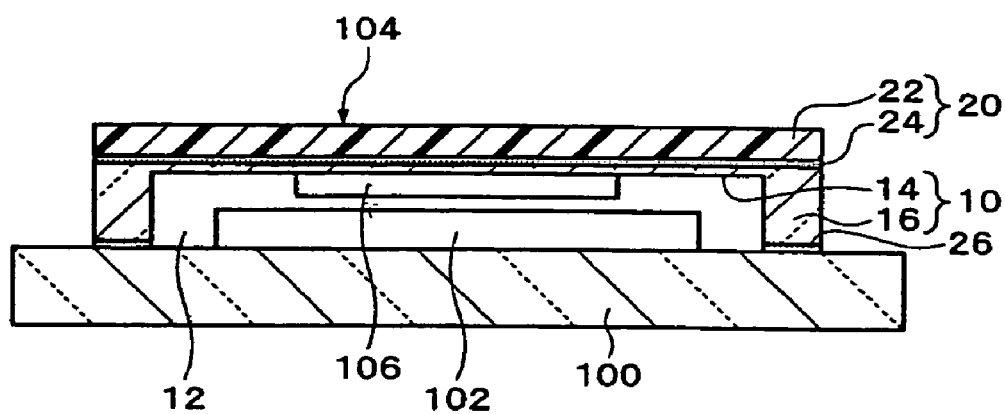
FIG. 1 shows a sealing substrate and display device in accordance with a first embodiment of the present invention.

The objective of embodiments of the present invention is to make a lighter sealing substrate without insufficiency of strength or increase in the permeation of moisture or oxygen.

(1) A sealing substrate in accordance with one embodiment of the present invention comprises:

a first substrate which has a hollow portion formed in a first surface of the first substrate, a plate portion forming a bottom surface of the hollow portion and a frame portion forming an inner wall surface of the hollow portion; and a second substrate attached to a second surface of the first substrate, wherein the second substrate is formed of a material of a specific gravity lower than a specific gravity of the first substrate.

This embodiment of the present invention makes it possible to make the sealing substrate lighter, by forming the second substrate of a material of a specific gravity less than that of the first substrate. Since the second substrate is attached to the first substrate, the strength of the first substrate in which the hollow portion is formed is not insufficient. Since a deep hollow portion can be formed in the first substrate, it is not necessary to provide a thick bonding layer for bonding the sealing substrate, which prevents any additional permeation of moisture or oxygen.

(2) With this sealing member, first substrate may be formed of an inorganic oxide.

(3) With this sealing member, the second substrate may be formed of resin.

(4) With this sealing member, the second substrate may be a single layer.

(5) With this sealing member, the second substrate may be formed of a material including a resin selected from a group of polyolefine, polyester, an ethylene vinyl acetate copolymer, an ethylene methyl methacrylate copolymer, and ionomer resin.

(6) With this sealing member, the second substrate may comprise a plurality of layers.

(7) With this sealing member, the second substrate may comprise a base material layer and a layer for bonding or adhesion.

(8) With this sealing member, the base layer may be formed of a material including a resin selected from a group of polyethylene terephthalate, a polyamide, polyolefine, a polycarbonate, a polyimide, polyethel sulfonic acid, an epoxy compound, polystyrene, and a cellulose resin; and the layer for bonding or adhesion may be formed of a material including a resin selected from a group of silicone, an acrylic resin, a metacrylic resin, an epoxy compound, polyurethane, an ethylene vinyl acetate copolymer, and styrene-butadiene rubber.

(9) With this sealing member, the second substrate may further comprise a buffer layer.

(10) With this sealing member, the buffer layer may be formed of a material including a resin selected from a group of styrene-butadiene rubber, silicon rubber, latex, and polyurethane.

(11) With this sealing member, the first substrate may be formed of an inorganic oxide selected from a group of glass, quartz, and ceramic.

(12) With this sealing member, the first substrate may be formed of a glass selected from a group of soda-lime glass, borosilicate glass, aluminosilicate glass, and silicate glass.

(13) With this sealing member, the thickness of the first substrate may be within the range of greater than or equal to 0.1 mm but less than or equal to 1.1 mm;

the height of the inner wall surface of the hollow portion may be within the range of greater than or equal to 0.05 mm but less than or equal to 0.8 mm; and the thickness of the plate portion may be within the range of greater than or equal to 0.01 mm but less than or equal to 0.9 mm.

(14) With this sealing member, the thickness of the second substrate may be within the range of greater than or equal to 0.01 mm but less than or equal to 0.4 mm.

(15) With this sealing member, the total thickness of the first and second substrates may be within the range of greater than or equal to 0.1 mm but less than or equal to 1.5 mm.

(16) A display device in accordance with one embodiment of the present invention comprises:

the above-described sealing substrate; and a display section encapsulated with the sealing substrate.

(17) An electronic instrument in accordance with one embodiment of the present invention comprises the above-described display device.

(18) A method of fabricating a sealing member in accordance with one embodiment of the present invention comprises:

attaching a first plate-shaped member to a second plate-shaped member, digging out of a surface of the first plate-shaped member to form a hollow portion on the opposite side to the surface on which the second plate-shaped member is attached, the second plate-shaped member being formed of a material having a specific gravity that is less than a specific gravity of the first plate-shaped member.

This embodiment of the present invention makes it possible to make the sealing substrate lighter, by forming the second plate-shaped member of a material of a specific gravity that is less than that of the first plate-shaped member. Since the second plate-shaped member is attached to the first plate-shaped member, the strength of the first plate-shaped member in which the hollow portion is formed is not insufficient. Since a deep hollow portion can be formed in the first plate-shaped member, it is not necessary to provide a thick bonding layer for bonding the sealing substrate, which prevents any additional permeation of moisture or oxygen.

(19) In this method of fabricating a sealing member, the attaching step may comprise:

attaching a film sheet having a thermoplastic resin on a bonding surface; and pressing the second plate-shaped member against in the direction of the first plate-shaped member while being heated.

(20) In this method of fabricating a sealing member, the second plate-shaped member may include a base material member and a member for bonding or adhesion; and the attaching step may comprise attaching the base material member to the first plate-shaped member for bonding or adhesion.

(21) In this method of fabricating a sealing member, the attaching step may comprise:

providing a molten resin for forming the second plate-shaped member may be provided on the first plate-shaped member.

(22) In this method of fabricating a sealing member, the digging step may comprise:

forming a plurality of the hollow portions may be formed in the first plate-shaped member; and may further comprise cutting the first and second plate-shaped members may be cut at each of the hollow portions, to obtain a plurality of sealing members.

These embodiments of the present invention are described below with reference to the accompanying figures.

First Embodiment

A sealing substrate and display device in accordance with a first embodiment of the present invention is shown in FIG. 1. The display device is an organic electroluminescent (EL) panel, by way of example. The display device has a substrate 100, a display section 102, and a sealing substrate 104. At least the display section 102 is sealed in by the sealing substrate 104. The space sealed in thereby could be filled with nitrogen or it could be in a vacuum. The display device could also have a drying agent 106. This display device emits light that has been generated by the display section 102 towards the substrate 100 side. In other words, an image is displayed on the substrate 100 side.

The sealing substrate 104 has a first substrate 10. The sealing substrate 104 is either impermeable to oxygen or moisture or is only barely permeable. The first substrate 10 could be formed of an inorganic oxide, such as glass (soda-lime glass, borosilicate glass, aluminosilicate glass, or silicate glass), quartz, or ceramic. The first substrate 10 could have optical transmissivity, or it could be configured to pass only light of a specific wavelength, or it could be impermeable to light. In other words, the first substrate 10 could be either transparent or non-transparent, or it could function as a color filter. The thickness of the first substrate 10 could be within the range of greater than or equal to 0.1 mm but less than or equal to 1.1 mm.

A hollow portion 12 is formed in a first surface of the first substrate 10. The first substrate 10 has a plate portion 14 that forms a bottom surface of the hollow portion 12 and a frame portion 16 that forms an inner wall surface of the hollow portion 12. The frame portion 16 is of a shape that surrounds greater than or equal to the display section 102. The frame portion 16 could be of an angular ring shape. The inner wall surface of the hollow portion 12 could be either perpendicular to the bottom surface, as shown in FIG. 1, or at an oblique angle thereto.

The depth of the hollow portion 12 (in other words, the height of the inner wall surface) is preferably greater than or equal to the total thickness of the display section 102 and the drying agent 106 (if provided). By way of example, the height of the inner wall surface could be greater than or equal to 0.05 mm but less than or equal to 0.8 mm. The thickness of the plate portion 14 could be greater than or equal to 0.01 mm but less than or equal to 0.9 mm.

The sealing substrate 104 has a second substrate 20. The second substrate 20 is affixed to a second surface of the first substrate 10 (the surface on the opposite side to the hollow portion 12). The affixing of the second substrate 20 ensures that the strength of the first substrate 10 in which the hollow portion 12 is formed is not insufficient. The second substrate 20 is affixed to at least the plate portion 14. The second substrate 20 could be affixed in such a manner as to extend over the frame portion 16. The second substrate 20 is formed of a material having a specific gravity that is less than that of the first substrate 10. This makes it possible to design a lighter sealing substrate 104. If the first substrate 10 is formed of an inorganic oxide, by way of example, the second substrate 20 could be formed of a resin. The thickness of the second substrate 20 could be greater than or equal to 0.01 mm but less than or equal to 0.4 mm.

The second substrate 20 could be formed of a plurality of layers. The second substrate 20 shown in FIG. 1 has a base layer 22 and a layer 24 for bonding or adhesion. The base layer 22 could be formed of a resin that is any one of polyethylene terephthalate, a polyamide, polyolefine, a polycarbonate, a polyimide, polyether sulfonic acid, an epoxy compound, polystyrene, or a cellulose resin. The layer 24 for bonding or adhesion could be formed of a resin that is any one of silicone, an acrylic resin, a metacrylic resin, an epoxy compound, polyurethane, an ethylene vinyl acetate copolymer, or styrene-butadiene rubber. The layer 24 for bonding or adhesion is preferably attached hermetically to the first substrate 10.

The sealing substrate 104 is affixed to the substrate 100 (the substrate in which the display section 102 is formed) by a bonding layer. With this embodiment, the hollow portion 12 is formed to be deep, so it is not necessary to make the bonding layer 26 thick. This therefore ensures that there is no further addition in the permeability of moisture or oxygen into the region sealed by the sealing substrate 104. It would be sufficient to provide the bonding layer 26 with a thickness of approximately 1 to 10 µm, or about 3 µm or 5 µm, by way of example. The thickness of the sealing substrate 104 (the total thickness of the first and second substrate 10 and 20) could be greater than or equal to 0.1 mm but less than or equal to 1.5 mm.

Figure 2:
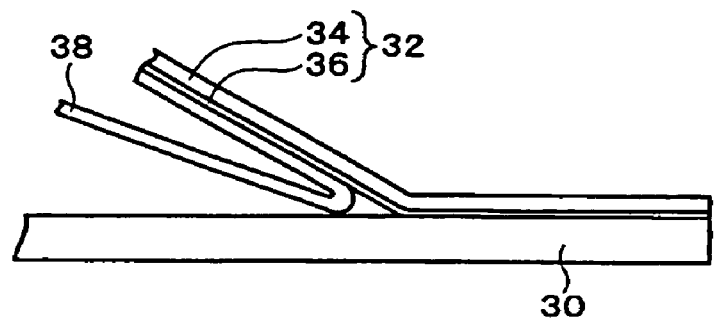
FIG. 2 is illustrative of the method of fabricating a sealing substrate in accordance with the first embodiment of the present invention.

The sealing substrate 104 in accordance with this embodiment has the configuration described above, and the method of fabrication thereof is described below. The method of fabricating the sealing substrate 104 includes a first plate-shaped member 30 to which is attached a second plate-shaped member 32, as shown in FIG. 2. If necessary, the first and second plate-shaped members 30 and 32 are cut to form the above-described first and second substrates 10 and 20. The second plate-shaped member 32 has a member for foundation 34 (which forms the above-described base layer 22) and a member for bonding or adhesion 36 (which forms the above-described the layer 24 for bonding or adhesion).

A peel-off sheet 38 is pasted to the member for bonding or adhesion 36, and the first plate-shaped member 32 is attached to the second plate-shaped member 30 while this sheet is being peeled off. The member for bonding or adhesion 36 is used for handling.

Figure 3:
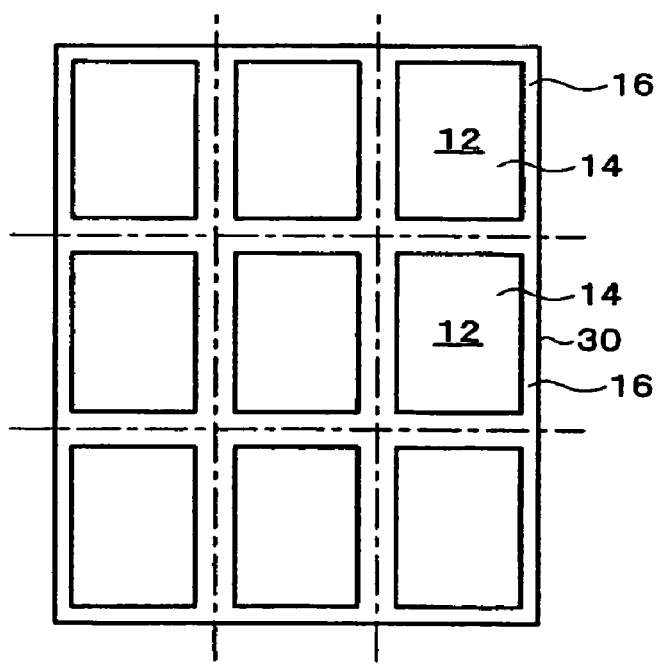
FIG. 3 further is illustrative of the method of fabricating a sealing substrate in accordance with the first embodiment of the present invention.

At least one hollow portion 12 (a plurality thereof in FIG. 3) is subsequently formed in the first plate-shaped member 30, as shown in FIG. 3. More specifically, each hollow portion 12 is formed in a surface that is on the opposite side of the first plate-shaped member 30 from that to which the second plate-shaped member 32 is affixed. The formation of the hollow portions 12 could be done by any one of sand-blasting, etching (such as wet etching), carving, or grinding. With this embodiment, the attachment of the second plate-shaped member 32 makes it possible to prevent damage to the first plate-shaped member 30.

The first and second plate-shaped members 30 and 32 are cut as necessary for each hollow portion 12 if a plurality of hollow portions 12 has been formed, or for one hollow portion 12. Since the first plate-shaped member 30 is attached to the second plate-shaped member 32, no damage is caused during cutting and transportation (such as during transportation by suction). Note that if the second plate-shaped member 32 is provided away from the cutting lines, only the first plate-shaped member 30 is cut. This makes it possible to obtain the sealing substrate 104 (see FIG. 1). In the example shown in FIG. 3, a plurality of the sealing substrates 104 (the first and second substrates 10 and 20) can be obtained.

Since the first substrate 10 has the second substrate 20 attached thereto, it is possible to prevent damage while attaching it to the substrate 100 or while attaching the drying agent 106. Note that if the step of attaching the sealing substrate 104 is done in a dry environment, there will be no incursion of moisture into the sealed space. Making the sealing substrate 104 thinner and lighter ensures that the display device can also be thinner and lighter. In the display device, the second substrate 20 that forms a surface layer of the sealing substrate 104 is formed of a resin, so it improves the shock resistance. The sealing substrate 104 can be shielded from oxygen and moisture by the first substrate 10.

Second Embodiment

Figure 4:
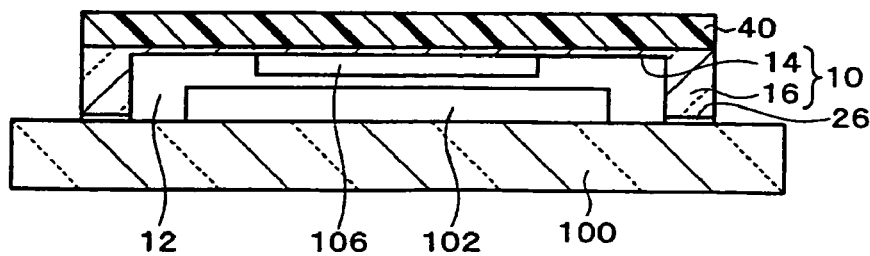
FIG. 4 shows a sealing substrate and display device in accordance with a second embodiment of the present invention.

A sealing substrate and display device in accordance with a second embodiment of the present invention is shown in FIG. 4. The sealing substrate of the display device of FIG. 4 has a single-layer second substrate 40. In all other points, the configuration is as described for the first embodiment. The single-layer second substrate 40 could be formed of a resin that is any one of polyolefine, polyester, a polyethylene vinyl acetate copolymer, or a polyethylene methyl methacrylate copolymer.

Figure 5:
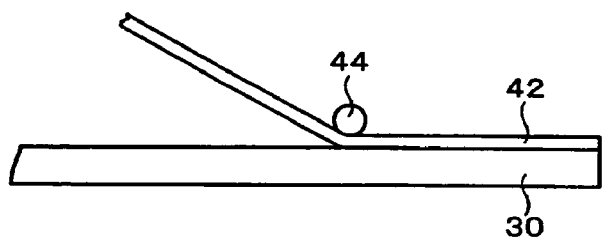
FIG. 5 is illustrative of the method of fabricating a sealing substrate in accordance with the second embodiment of the present invention.

The method of fabricating this sealing substrate is illustrated in FIG. 5. In the example of FIG. 5, a second plate-shaped member 42 is a single-layer or multi-layer sheet having a thermoplastic resin on a bonding surface side. The second plate-shaped member 42 is pressed in the direction of the first plate-shaped member 30 while heat is applied thereto. A roller 44 could be used to apply the pressure, and the heat could also be applied by the roller 44. The second plate-shaped member 42 can be attached to the first plate-shaped member 30 in this manner. Subsequent steps are as described with reference to the first embodiment.

Figure 6:
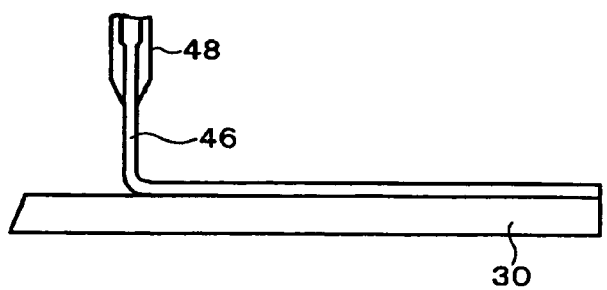
FIG. 6 is illustrative of another method of fabricating a sealing substrate in accordance with the second embodiment of the present invention.

Another method of fabricating the sealing substrate is illustrated in FIG. 6. In the example of FIG. 6, the second plate-shaped member is formed on the first plate-shaped member 30 by providing molten resin 46 on the first plate-shaped member 30. The molten resin 46 could be supplied from a dispenser 48. Subsequent steps are as described with reference to the first embodiment. The sealing substrate in accordance with this embodiment exhibits the operational effects that were described with reference to the first embodiment.

Third Embodiment

Figure 7:
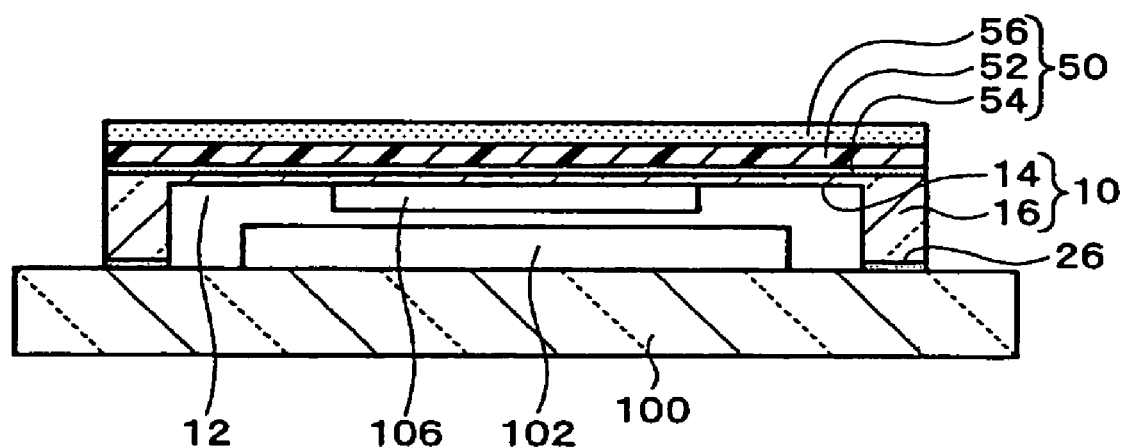
FIG. 7 shows a sealing substrate and display device in accordance with a third embodiment of the present invention.

A sealing substrate and display device in accordance with a third embodiment of the present invention is shown in FIG. 7. The sealing substrate of the display device of FIG. 7 has a second substrate 50 that is formed from a plurality of layers. The second substrate 50 has abase layer 52, a layer 54 for bonding or adhesion, and a buffer layer 56. Note that the layer 54 for bonding or adhesion could be omitted. In all other points, the configuration is as described for the first embodiment.

The buffer layer 56 forms a surface layer on the opposite side of the sealing substrate from the hollow portion 12. The buffer layer 56 is formed from a resin that is one of styrene-butadiene rubber, silicon rubber, latex, or polyurethane. The buffer layer 56 enables a further improvement in shock resistance. The sealing substrate in accordance with this embodiment exhibits the operational effects that were described with reference to the first embodiment.

Other Embodiments

Figure 8:
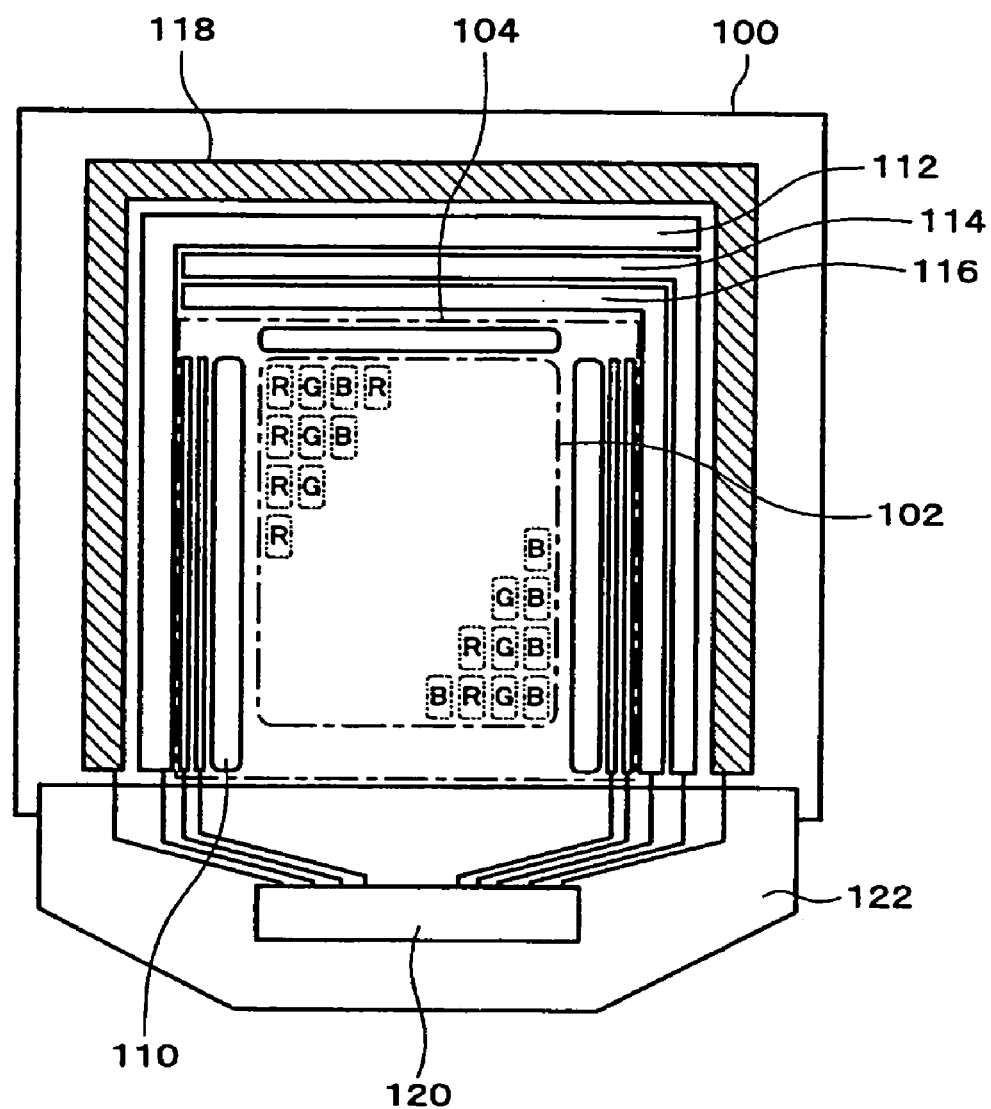
FIG. 8 is illustrative of a substrate on which a display section is formed.

Details of the substrate 100 provided on the display section 102 of FIG. 1 are shown in FIG. 8. The substrate 100 has optical transmissivity and could be a glass substrate or plastic substrate. The display section 102 is provided on the substrate 100 within the region that is sealed by the sealing substrate 104. A scan-side drive circuit 110 (together with wiring connected thereto) is formed on the substrate 100, for driving the display section 102. With this embodiment, the scan-side drive circuit 110 (together with the wiring connected thereto) is also formed within the region that is sealed by the sealing substrate 104. Power lines 112, 114, and 116 corresponding to the three colors red, green, and blue are formed on the substrate 100. Cathode wiring 118 is formed on the substrate 100. A flexible substrate 122 on which is mounted an integrated circuit chip 120 is attached to the substrate 100. The integrated circuit chip 120 is connected electrically to the wiring formed on the substrate 100. The integrated circuit chip 120 has a data-side drive circuit.

Figure 9:
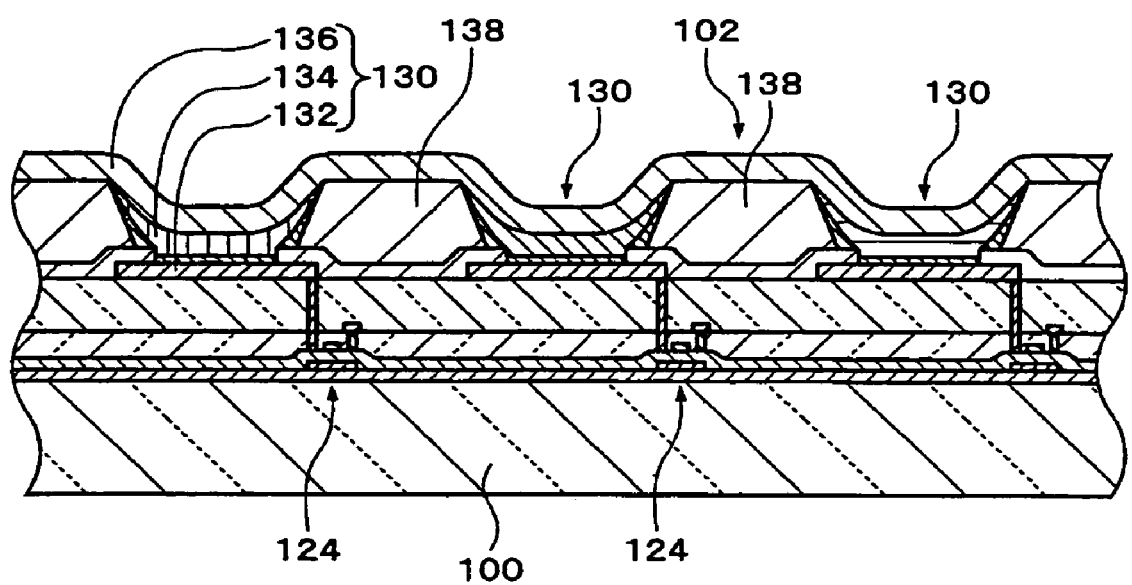
FIG. 9 is illustrative of the display section.

Details of the integrated circuit chip 120 are shown in FIG. 9. A plurality of switching elements 124 (such as thin-film transistors) are formed on the substrate 100 in the display section 102. The display section 102 has a plurality of light-emitting elements 130 that emit light in a plurality of colors (such as the three colors red, green, and blue). The switching elements 124 control the light-emitting elements 130. Each light-emitting element 130 includes a pixel electrode 132 and a cathode 136 (or rather, a part thereof), with a light-emitting layer 134 therebetween. Each pixel electrode 132 is connected electrically to the power lines 112, 114, and 116 of FIG. 8. Each cathode 136 is connected electrically to the cathode wiring 118 of FIG. 8. The light-emitting layer 134 emits light in accordance with a current supplied from the pixel electrode 132.

Neighboring light-emitting layers 134 are separated by bank portions 138. The light-emitting layer 134 could be formed of a high-molecular substance or a low-molecular substance. If a high-molecular material is used as the light-emitting layer 134, it is important to shield it from oxygen and moisture, so use of the sealing substrate of the present invention is effective therefor.

Figure 10:
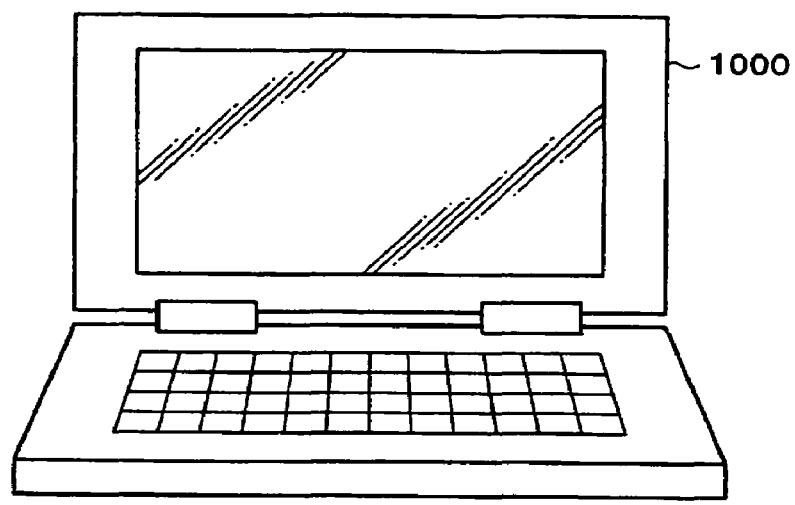
FIG. 10 shows an electronic instrument in accordance with an embodiment of the present invention.
Figure 11:
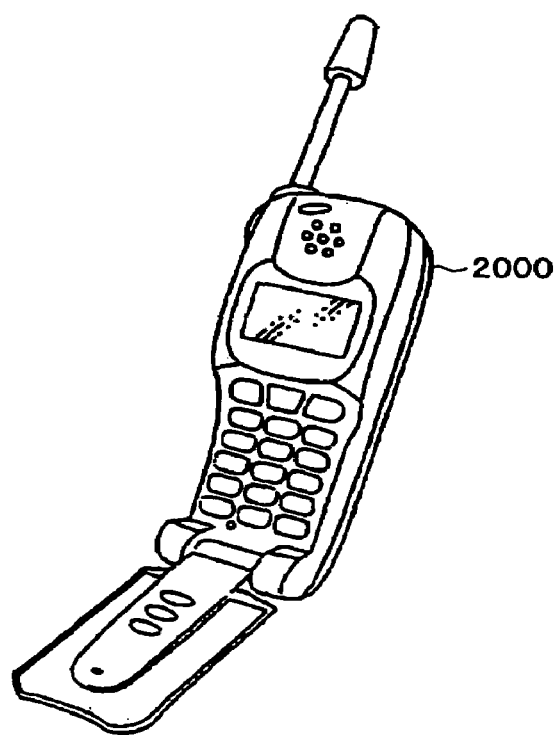
FIG. 11 shows another electronic instrument in accordance with an embodiment of the present invention.

A notebook type of personal computer 1000 shown in FIG. 10 and a mobile phone 2000 shown in FIG. 11 are examples of electronic instruments having the display device in accordance with embodiments of the present invention.

The present invention is not limited to the above-described embodiments, and various modifications can be made. For example, the present invention includes various other configurations substantially the same as the configurations described in the embodiments (in function, method and effect, or in objective and effect, for example). The present invention also includes a configuration in which an unsubstantial portion in the described embodiments is replaced. The present invention also includes a configuration having the same effects as the configurations described in the embodiments, or a configuration able to achieve the same objective. Further, the present invention includes a configuration in which a publicly known technique is added to the configurations in the embodiments.

What is claimed is:

1. A light-emitting device comprising:
   an element substrate having a light-emitting element formed thereon; and
   a sealing substrate to seal the light-emitting element, the sealing substrate including:
   a first substrate which has a hollow portion formed in a first surface thereof, a plate portion forming a bottom surface of the hollow portion, and a frame portion forming an inner wall surface of the hollow portion, the frame portion attached to the element substrate with an adhesive so as to secure a space between the element substrate and the sealing substrate, and
   a second substrate attached to a second surface of the first substrate, the second substrate formed of a material of a specific gravity lower than a specific gravity of the first substrate, the second substrate being formed of resin.

2. The light-emitting device according to claim 1, wherein the first substrate is formed of an inorganic oxide.

3. The light-emitting device according to claim 2, wherein the first substrate is formed of an inorganic oxide selected from a group of glass, quartz, and ceramic.

4. The light-emitting device according to claim 3, wherein the first substrate is formed of a glass selected from a group of soda-lime glass, borosilicate glass, aluminosilicate glass, and silicate glass.

5. The light-emitting device according to claim 1, wherein the second substrate is a single layer.

6. The light-emitting device according to claim 1, wherein the second substrate is formed of a material including a resin selected from a group of polyolefine, polyester, an ethylene vinyl acetate copolymer, an ethylene methyl methacrylate copolymer, and an ionomer resin.

7. The light-emitting device according to claim 1, wherein the second substrate includes a plurality of layers.

8. The light-emitting device according to claim 7, wherein the second substrate includes a base material layer and a layer for bonding or adhesion.

9. The light-emitting device according to claim 8, wherein:
   the base material layer is formed of a material including a resin selected from a group of polyethylene terephthalate, a polyamide, polyolefine, a polycarbonate, a polyimide, polyethel sulfonic acid, an epoxy compound, polystyrene, and a cellulose resin, and the layer for bonding or adhesion is formed of a material including a resin selected from a group of silicone, an acrylic resin, a metacrylic resin, an epoxy compound, polyurethane, an ethylene vinyl acetate copolymer, and styrene-butadiene rubber.

10. The light-emitting device according to claim 8, wherein the second substrate further includes a buffer layer.

11. The light-emitting device according to claim 10, wherein the buffer layer is formed of a material including a resin selected from a group of styrene-butadiene rubber, silicon rubber, latex, and polyurethane.

12. The light-emitting device according to claim 1, wherein:

the thickness of the first substrate is within the range of greater than or equal to 0.1 mm and less than or equal to 1.1 mm, the height of the inner wall surface of the hollow portion is within the range of greater than or equal to 0.05 mm and less than or equal to 0.8 mm, and the thickness of the plate portion is within the range of greater than or equal to 0.01 mm and less than or equal to 0.9 mm.

13. The light-emitting device according to claim 12, wherein the thickness of the second substrate is within the range of greater than or equal to 0.01 mm and less than or equal to 0.4 mm.

14. The light-emitting device according to claim 13, wherein the total thickness of the first and second substrates is within the range of greater than or equal to 0.1 mm and less than or equal to 1.5 mm.

* * * * *